(12) United States Patent
Keser et al.

(10) Patent No.: US 9,806,052 B2
(45) Date of Patent: Oct. 31, 2017

(54) SEMICONDUCTOR PACKAGE INTERCONNECT

(71) Applicant: QUALCOMM Incorporated, San Diego, CA (US)

(72) Inventors: Lizabeth Ann Keser, San Diego, CA (US); Reynante Tamunan Alvarado, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/854,039

(22) Filed: Sep. 15, 2015

(65) Prior Publication Data

US 2017/0077053 A1    Mar. 16, 2017

(51) Int. Cl.
*H01L 23/48* (2006.01)
*H01L 21/44* (2006.01)
(Continued)

(52) U.S. Cl.
CPC .......... *H01L 24/45* (2013.01); *H01L 21/4853* (2013.01); *H01L 21/565* (2013.01); *H01L 21/568* (2013.01); *H01L 21/6835* (2013.01); *H01L 23/3114* (2013.01); *H01L 23/49811* (2013.01); *H01L 23/5389* (2013.01); *H01L 24/13* (2013.01); *H01L 24/19* (2013.01); *H01L 24/20* (2013.01); *H01L 23/49816* (2013.01); *H01L 25/16* (2013.01); *H01L 2221/68345* (2013.01); *H01L 2224/04105* (2013.01); *H01L 2224/12105* (2013.01); (Continued)

(58) Field of Classification Search
CPC ................. H01L 24/83; H01L 21/4853; H01L 21/76898; H01L 21/486; H01L 23/5384; H01L 23/49811; H01L 23/3107; H01L 24/13; H01L 21/565; H01L 24/49; H01L 24/48; H01L 24/45; H01L 24/46; H01L 24/85; H01L 24/19; H01L 24/20
See application file for complete search history.

(56) References Cited

U.S. PATENT DOCUMENTS 6,429,388 B1   8/2002  Interrante et al.
6,683,375 B2   1/2004  Joshi et al.
(Continued)

FOREIGN PATENT DOCUMENTS

CN    101894821 A    11/2010
CN    104425425 A    3/2015
WO    2011105598 A1  9/2011

OTHER PUBLICATIONS

International Search Report and Written Opinion—PCT/US2016/051230—ISA/EPO—dated Feb. 15, 2017.
(Continued)

*Primary Examiner* — Alonzo Chambliss
(74) *Attorney, Agent, or Firm* — Qualcomm Incorporated

(57) ABSTRACT

A semiconductor package interconnect system may include a conductive pillar having a core, a first layer surrounding the core, and a second layer surrounding the first layer. The core may be composed of a drawn copper wire, the first layer may be composed of nickel, and the second layer may be composed of a solder. A method for manufacturing a semiconductor package with such a conductive pillar may include placing a plurality of conductive pillars on a substrate using a stencil process.

24 Claims, 10 Drawing Sheets

(51) Int. Cl.
*H01L 23/00* (2006.01)
*H01L 21/683* (2006.01)
*H01L 23/538* (2006.01)
*H01L 21/48* (2006.01)
*H01L 21/56* (2006.01)
*H01L 23/31* (2006.01)
*H01L 23/498* (2006.01)
*H01L 25/16* (2006.01)

(52) U.S. Cl.
CPC ........... *H01L 2224/13012* (2013.01); *H01L 2224/13024* (2013.01); *H01L 2224/1357* (2013.01); *H01L 2224/13147* (2013.01); *H01L 2224/13561* (2013.01); *H01L 2224/32225* (2013.01); *H01L 2224/48091* (2013.01); *H01L 2224/48227* (2013.01); *H01L 2224/73265* (2013.01); *H01L 2225/1035* (2013.01); *H01L 2225/1058* (2013.01); *H01L 2924/014* (2013.01); *H01L 2924/15311* (2013.01); *H01L 2924/351* (2013.01)

(56) References Cited

U.S. PATENT DOCUMENTS

| | | | | |
|---|---|---|---|---|
| 7,671,457 B1* | 3/2010 | Hiner | ............... | H01L 21/4857 257/678 |
| 7,923,304 B2 | 4/2011 | Choi et al. | | |
| 8,039,304 B2* | 10/2011 | Pagaila | ............... | H01L 21/561 257/E21.705 |
| 8,133,762 B2* | 3/2012 | Pagaila | ............... | H01L 21/568 257/741 |
| 8,372,741 B1* | 2/2013 | Co | ............... | H01L 24/03 219/56.22 |
| 8,597,983 B2* | 12/2013 | Gong | ............... | H01L 23/49811 257/676 |
| 8,772,152 B2* | 7/2014 | Co | ............... | H01L 24/03 219/56.22 |
| 8,916,421 B2 | 12/2014 | Gong et al. | | |
| 8,952,261 B2* | 2/2015 | Ishihara | ............... | H01L 23/3114 174/255 |
| 9,012,789 B1* | 4/2015 | Yoshida | ............... | H01L 23/3128 174/261 |
| 2008/0158842 A1* | 7/2008 | Stiborek | ............... | H01L 21/4853 361/783 |
| 2012/0153472 A1* | 6/2012 | Pagaila | ............... | H01L 21/568 257/738 |
| 2013/0015576 A1* | 1/2013 | Lin | ............... | H01L 24/11 257/737 |
| 2014/0151863 A1* | 6/2014 | Kim | ............... | H01L 23/3128 257/672 |
| 2014/0159236 A1* | 6/2014 | Kim | ............... | H01L 24/11 257/737 |
| 2014/0203443 A1* | 7/2014 | Pagaila | ............... | H01L 21/568 257/773 |
| 2014/0262470 A1 | 9/2014 | Hsiao et al. | | |
| 2015/0206865 A1 | 7/2015 | Yu et al. | | |

OTHER PUBLICATIONS

Partial International Search Report—PCT/US2016/051230—ISA/EPO—dated Dec. 19, 2016.

* cited by examiner

SEMICONDUCTOR PACKAGE INTERCONNECT

FIELD OF DISCLOSURE

This disclosure relates generally to semiconductor packages and more specifically, but not exclusively, to fan-out wafer level semiconductor packages (FO-WLPs).

BACKGROUND

In package on package semiconductor packages, such as a FO-WLP, it is necessary to provide a conductive pathway from a bottom surface of a bottom package, thorough the bottom package, to a top package. In a conventional approach, this can be accomplished using a number of techniques. For example, holes may be created in the bottom package and then filled or plated with copper, a printed circuit board bar, a through substrate via bar, or a copper plated material is provided proximate to a die on the bottom package and a mold is used to encapsulate the copper plated material and the die to form the bottom package. However, these are expensive and time consuming processes. Also, these methods make it difficult to achieve a fine pitch (less than 0.4P to 0.2P, for example) because the techniques used result in a large copper footprint for the conductive pathway (e.g. such as a through substrate via bar, redistribution layer pathway, signal wires etc.). Further, these techniques do not allow larger aspect ratios for the conductive pathways (5 to 1 or larger height to width) nor do they allow closely spaced conductive pathways because of the smaller aspect ratios. In addition, the grain size of electro plated copper is not as good for conduction as drawn copper due to different current density and plating deposition time that could be applied for electro plated copper. Drawing is a metalworking process that uses tensile forces to stretch metal. As the metal is drawn (pulled), it stretches thinner, into a desired shape and thickness. To make drawn copper, a copper wire or bar is used as the starting stock and is drawn through a die to reduce its diameter and increase its length. The diameter of the die and amount of stretching (amount of tensile force applied in the drawing process and duration) used during the drawing process will determine the aspect ratio of the resulting drawn copper wire. Drawing is usually done at room temperature, thus classified a cold working process, however it may be performed at elevated temperatures to hot work large wires, rods or bars in order to reduce forces. Drawing differs from rolling in that the pressure of drawing is not transmitted through the turning action of the mill but instead depends on force applied locally near the area of compression. This means the amount of possible drawing force is limited by the tensile strength of the material, a fact that is particularly evident when drawing thin wires.

Accordingly, there is a need for systems, apparatus, and methods that improve upon conventional approaches including the improved methods, system and apparatus provided hereby.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

In one aspect, a package interconnect system includes: a conductive pillar with a core and a first layer at least partially surrounding the core; a redistribution layer coupled to the conductive pillar; and a die coupled to the redistribution layer proximate to the conductive pillar.

In another aspect, a package includes: a dielectric material; a redistribution layer coupled to the dielectric material; a die coupled to the redistribution layer; a plurality of conductive pillars coupled to the redistribution layer proximate to the die; and the plurality of conductive pillars comprising a core and a first layer at least partially surrounding the core.

In still another aspect, a method for forming a package including: applying an adhesive material to a carrier; forming a plurality of conductive pads on the adhesive material; forming a plurality of solder joints on the plurality of conductive pads; forming a plurality of conductive pillars, each of the plurality of conductive pillars having a core and a first layer at least partially surrounding the core; aligning, by a stencil, a plurality of conductive pillars on the plurality of solder joints; reflowing the plurality of conductive pillars and the plurality of solder joints to couple the plurality of conductive pillars to the plurality of conductive pads; attaching a die to the adhesive material; applying a molding compound, the molding compound encapsulating the die; removing the carrier and the adhesive material; and forming a dielectric layer and a redistribution layer, the redistribution layer coupled to the plurality of conductive pads.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure, and in which.

Figure 1A:
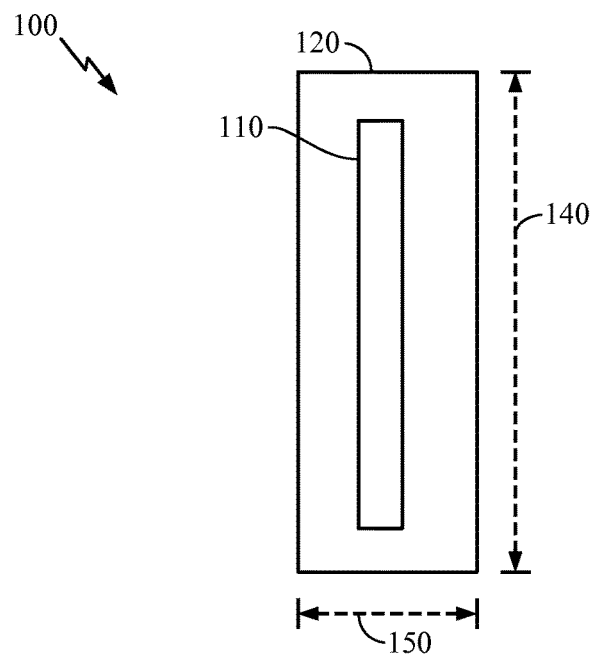
FIGS. 1A and B illustrate a conductive pillar with one or two outer layers in accordance with some examples of the disclosure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

The exemplary methods, apparatus, and systems disclosed herein advantageously address the industry needs, as well as other previously unidentified needs, and mitigate shortcomings of the conventional methods, apparatus, and systems. For example, use of preformed conductive pillars will allow a high aspect ratio (5 to 1 or better) of the pillar height versus the pillar width and results in a fine pitch (e.g. 0.2P) interconnect between top and bottom surfaces of a package substrate. This will allow the use of smaller conductive pad sizes and a fine pitch due to the smaller conductive column width while maintaining a higher a stand-off between the substrate and a printed circuit board due to the larger conductive pillar height. These features significantly improve the board level reliability as well as reduce the cost and complexity of manufacturing semiconductor packages.

FIG. 1A illustrates a conductive pillar with one outer layer in accordance with some examples of the disclosure. As shown in FIG. 1A, a conductive pillar 100 may have a core 110 and a first layer 120 surrounding the core 110. The core 110 and the first layer 120 may be composed of electrically conductive material such that the conductive pillar 100 may be used as an electrical pathway as discussed below. The core 110 may be composed of a drawn copper wire with a grain size greater than a plated copper and the first layer 120 may be composed of a solder material. While the first layer 120 is shown completely surrounding the core 110, it should be understood that the first layer 120 may alternatively partially surround the core 110. The creation of a drawn copper wire involves a more simplified process than plating a copper core and the greater grain size results in better electrical conductivity than plated copper. In addition, using only the first layer 120 may simplify and lower the cost of the manufacturing process even further by not adding additional layers on the core 110. The solder material of the first layer 120 may allow the conductive pillar 100 to be coupled or attached to another component, such as a conductive pad for instance, using a reflow process that reflows the solder material in the first layer 120 to aid the coupling or attachment to another component (see FIGS. 1C and 1D).

The conductive pillar 100 may have a height 140 greater than a width 150. In one case, an aspect ratio of the height 140 and the width 150 may be 5 to 1. In other examples, the disclosed pillar may have other aspect ratios such as 2:1, 3:1, 4:1, 6:1, 7:1, 8:1, 9:1, 10:1 and greater. A person of skill in the art may select a conductive pillar 100 to have an aspect ratio that is greater than 1:1. A person of skill may select the greater than 1:1 aspect ratio depending on the desired height of the package. A greater aspect ratio may increase the height of the package. Having an aspect ratio greater than one allows the use of the conductive pillar in larger substrates or packages that will result in an increase in board level reliability and electrical performance. This is because the greater than 1:1 aspect ratio means that the conductive pillar 100 has more copper and therefore will have greater electrical and thermal conductivity. Also the greater than 1:1 aspect ratio means that there will be less CTE (coefficient of thermal expansion) mismatch between the die (such as die 230 shown in FIG. 2A) and a printed circuit board (not shown, but could possibly be connected to the package solder balls (such as solder balls 280 shown in FIG. 2A). The conductive pillar 100 may have a substantially cylindrical shape or a substantially rectangular shape. The aspect ratio of the conductive pillar 100 may be achieved during the manufacturing process of the conductive pillar 100. For example, smaller aspect ratios may be achieved by using a larger diameter die during the drawing process (a larger diameter die will result in the extruded/drawn copper having a larger diameter and aspect ratio) or drawing the copper longer to stretch the resulting conductive pillar 100.

Figure 1B:
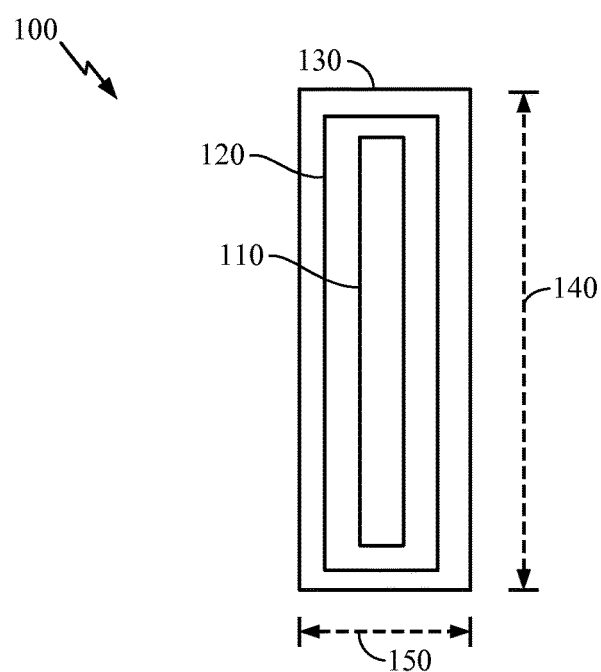
FIGS. 1C and D illustrate a conductive pillar before and after a solder reflow process in accordance with some examples of the disclosure.
Figure 1C:
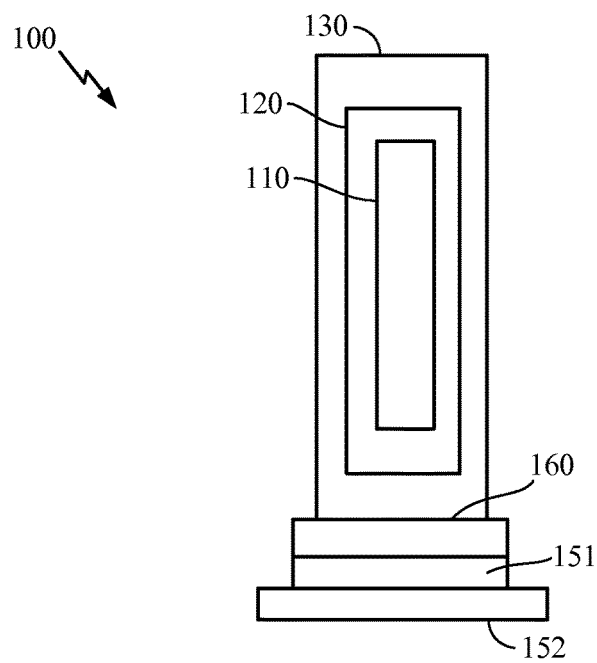

FIG. 1B illustrates a conductive pillar with two outer layers in accordance with some examples of the disclosure. As shown in FIG. 1B, a conductive pillar 100 may have a core 110, a first layer 120 surrounding the core 110, and a second layer 130 surrounding the first layer 120. The core 110, the first layer 120, and the second layer 130 may be composed of electrically conductive material such that the conductive pillar 100 may be used as an electrical pathway as discussed below. The core 110 may be composed of a drawn copper wire with a grain size greater than a plated copper. Unlike the single layer shown in FIG. 1A, in the dual layer shown in FIG. 1B, the first layer 120 may be a barrier metal, such as nickel, for the core 110 that prevents oxidation and intermetallic formation between the core 110 and the second layer 130 (e.g. between a copper core and a solder layer). Intermetallic formations (intermetallics) could completely consume the core, which is undesirable because intermetallics are brittle and do not have the conductivity of other materials, such as copper. The second layer 130 may be composed of a solder material such that the conductive pillar 100 may be coupled or attached to another component, such as a conductive pad for instance, using a reflow process that reflows the solder material in the second layer 130 to aid the coupling or attachment to another component. The conductive pillar 100 may have a height 140 greater than a width 150. In one case, an aspect ratio of the height 140 and the width 150 may be 5 to 1. Having an aspect ratio greater than one allows the use of the conductive pillar in larger substrates or packages that will result in an easier to handle substrate or package as well as an increase in board level reliability and electrical performance. In other examples, the disclosed pillar may have other aspect ratios such as 2:1, 3:1, 4:1, 6:1, 7:1, 8:1, 9:1, 10:1 and greater. A person of skill in the art may select a conductive pillar 100 to have an aspect ratio that is greater than 1:1. A person of skill may select the greater than 1:1 aspect ratio depending on the desired height of the package. A greater aspect ratio may increase the height of the package. Having an aspect ratio greater than one allows the use of the conductive pillar in larger substrates or packages that will result in an increase in board level reliability and electrical performance. This is because the greater than 1:1 aspect ratio means that the conductive pillar 100 has more copper and therefore will have greater electrical and thermal conductivity. Also the greater than 1:1 aspect ratio means that there will be less CTE (coefficient of thermal expansion) mismatch between the die (such as die 230 shown in FIG. 2A) and a printed circuit board (not shown, but could possibly be connected to the package solder balls (such as solder balls 280 shown in FIG. 2A). The conductive pillar 100 may have a substantially cylindrical shape or a substantially rectangular shape. The aspect ratio of the conductive pillar 100 may be achieved during the manufacturing process of the conductive pillar 100. For example, smaller aspect ratios may be achieved by using a larger diameter die during the drawing process (a larger diameter die will result in the extruded/drawn copper having a larger diameter and aspect ratio) or drawing the copper longer to stretch the resulting conductive pillar 100. As shown in FIG. 1C, the second layer 130 is uniformly distributed or coated on the first layer 120 before the reflow process.

FIG. 1C illustrates a conductive pillar with two outer layers before a solder reflow process is applied. It should be understood that while a conductive pillar with two outer layers is shown (e.g. see FIG. 1B), a conductive pillar with a single outer layer may be used as well (e.g. see FIG. 1A). As shown in FIG. 1C, a conductive pillar 100 may have a core 110, a first layer 120 surrounding the core 110, and a second layer 130 surrounding the first layer 120. The core 110, the first layer 120, and the second layer 130 may be composed of electrically conductive material such that the conductive pillar 100 may be used as an electrical pathway as discussed above. The core 110 may be composed of a drawn copper wire with a grain size greater than a plated copper and the first layer 120 may be a barrier metal, such as nickel, for the core 110 that prevents oxidation and intermetallic formation between the core 110 and the second layer 130 (e.g. between a copper core and a solder layer). The second layer 130 may be composed of a solder material such that the conductive pillar 100 may be coupled or attached to another component such as a solder joint 160, for instance, using a reflow process that reflows the solder material in the second layer 130 to aid the coupling or attachment to the solder joint 160 (see FIG. 1D). The solder joint 160 may be attached or on a conductive pad 151 coupled to redistribution layer 152 between the second layer 130 and the redistribution layer 152. The conductive pillar 100 may have a height 140 greater than a width 150. In one case, an aspect ratio of the height 140 and the width 150 may be 5 to 1. In other examples, the disclosed pillar may have other aspect ratios such as 2:1, 3:1, 4:1, 6:1, 7:1, 8:1, 9:1, 10:1 and greater. The conductive pillar 100 may have a substantially cylindrical shape or a substantially rectangular shape.

Figure 1D:
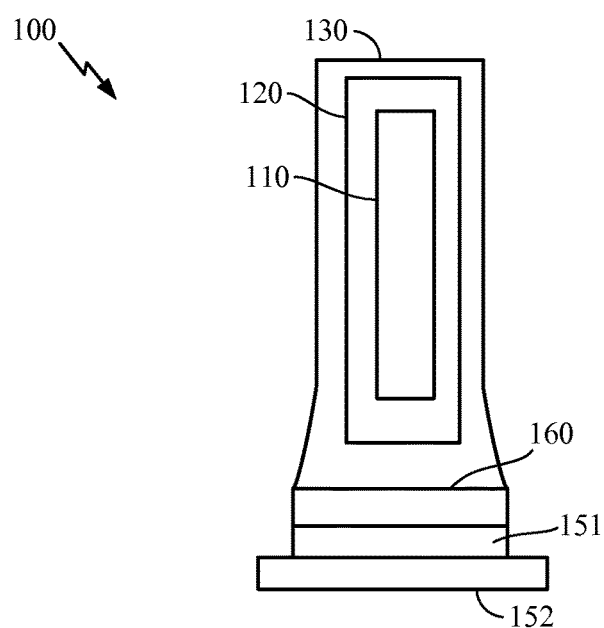

FIG. 1D illustrates a conductive pillar with two outer layers after a solder reflow process is applied. It should be understood that while a conductive pillar with two outer layers is shown (e.g. see FIG. 1B), a conductive pillar with a single outer layer may be used as well (e.g. see FIG. 1A). As shown in FIG. 1D, a conductive pillar 100 may have a core 110, a first layer 120 surrounding the core 110, and a second layer 130 surrounding the first layer 120. The core 110, the first layer 120, and the second layer 130 may be composed of electrically conductive material such that the conductive pillar 100 may be used as an electrical pathway as discussed above. The core 110 may be composed of a drawn copper wire with a grain size greater than a plated copper and the first layer 120 may be a conductive interface material, such as barrier metals, such as nickel or gold, for the core 110 that prevents oxidation and intermetallic formation between the core 110 and the second layer 130 (e.g. between a copper core and a solder layer). The second layer 130 may be composed of a solder material such that the conductive pillar 100 may be coupled or attached to another component such as a solder joint 160, for instance, using a reflow process that reflows the solder material in the second layer 130 to aid the coupling or attachment to the solder joint 160. After the solder reflow process, the solder material in the second layer 130 will flow down the sides of the conductive pillar 100 forming a flared shape on the bottom coupling the conductive pillar to the solder joint 160. The solder joint 160 may be attached or on a conductive pad 151 coupled to redistribution layer 152 between the second layer 130 and the redistribution layer 152. The conductive pillar 100 may have a height 140 greater than a width 150. In one case, an aspect ratio of the height 140 and the width 150 may be 5 to 1. In other examples, the disclosed pillar may have other aspect ratios such as 2:1, 3:1, 4:1, 6:1, 7:1, 8:1, 9:1, 10:1 and greater. The conductive pillar 100 may have a substantially cylindrical shape or a substantially rectangular shape.

Figure 2A:
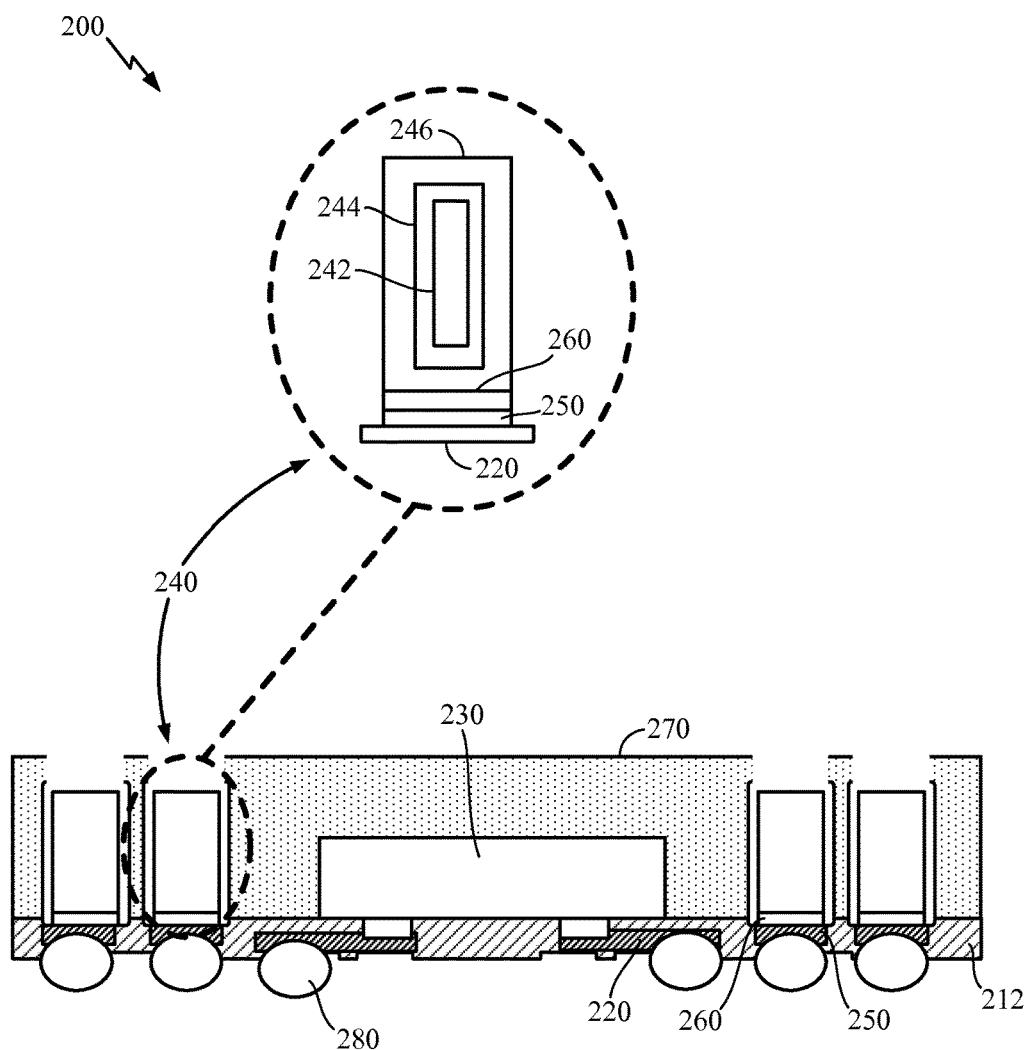
FIGS. 2A-C illustrate a various configurations of a semiconductor package interconnect system in accordance with some examples of the disclosure.

FIG. 2A illustrates a semiconductor package interconnect system in accordance with some examples of the disclosure. As shown in FIG. 2A, a semiconductor package 200 may include a dielectric material 212, a redistribution layer 220 (e.g. one or more metal layers) coupled to the dielectric material 212, a die 230 coupled to the redistribution layer 220, and a plurality of conductive pillars 240. Each of the plurality of conductive pillars 240 (e.g. conductive pillar 100) may have a core 242 (e.g. core 110 of FIG. 1B), a first layer 244 (e.g. first layer 120 of FIG. 1B) surrounding the core 242, and a second layer 246 (e.g. second layer 130 of FIG. 1B) surrounding the first layer 244. In another example, the conductive pillar 240 (e.g. conductive pillar 100) may have a core 242 and a first layer 244. In other words, in the another example, the conductive pillar may omit the second layer 246. The semiconductor package may include a plurality of conductive pads 250 coupled to redistribution layer 220 between the plurality of conductive pillars 240 and the redistribution layer 220, a plurality of solder joints 260 on the plurality of conductive pads 250 between the plurality of conductive pads 250 and the plurality of conductive pillars 240, and a mold 270 encapsulating the plurality of conductive pillars 240 and the die 230. As shown, the semiconductor package 200 may be suitable as bottom package in a package on package configuration (see FIG. 2B) or a stand-alone package with surface mounted devices (see FIG. 2C) and may include a plurality of solder balls 280 for external connections to the redistribution layer 220.

Figure 2B:
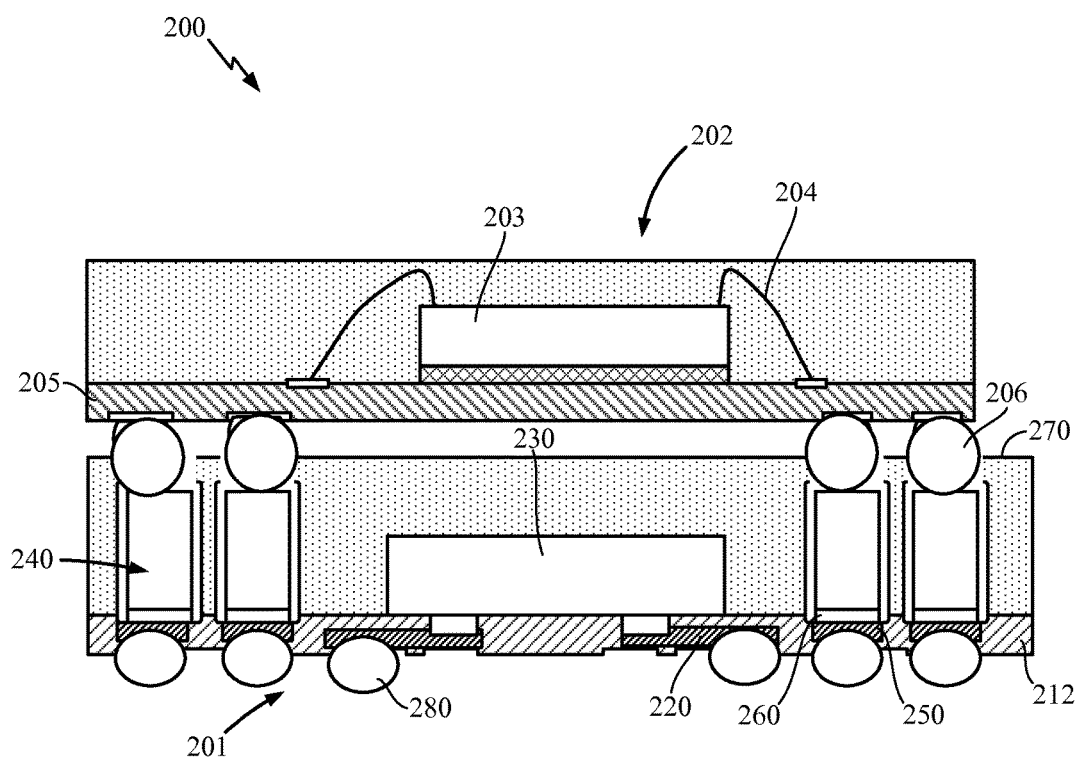

FIG. 2B illustrates a semiconductor package interconnect system in a package on package configuration in accordance with some examples of the disclosure. As shown in FIG. 2B, a semiconductor package 200 may include a bottom package 201 and a top package 202. The bottom package 201 may include a dielectric material 212, a redistribution layer 220 (e.g. one or more metal layers) coupled to the dielectric material 212, a die 230 coupled to the redistribution layer 220, and a plurality of conductive pillars 240. Each of the plurality of conductive pillars 240 (e.g. conductive pillar 100) may have a core 242 (e.g. core 110 of FIG. 1B), a first layer 244 (e.g. first layer 120 of FIG. 1B) surrounding the core 242, and a second layer 246 (e.g. second layer 130 of FIG. 1B) surrounding the first layer 244. In another example, the conductive pillar 240 (e.g. conductive pillar 100) may have a core 242 and a first layer 244. In other words, in the another example, the conductive pillar may omit the second layer 246. The bottom package 201 may include a plurality of conductive pads 250 coupled to redistribution layer 220 between the plurality of conductive pillars 240 and the redistribution layer 220, a plurality of solder joints 260 on the plurality of conductive pads 250 between the plurality of conductive pads 250 and the plurality of conductive pillars 240, a mold 270 encapsulating the plurality of conductive pillars 240 and the die 230, and a plurality of solder balls 280 for external connections to the redistribution layer 220. The top package 202 may include a component 203 (such as a logic die or memory die), wire bonds 204 to couple the component 203 to a dielectric 205 (such as a substrate), a plurality of connection points 206 (such as solder balls) coupling the top package 202 to plurality of conductive pillars 240.

Figure 2C:
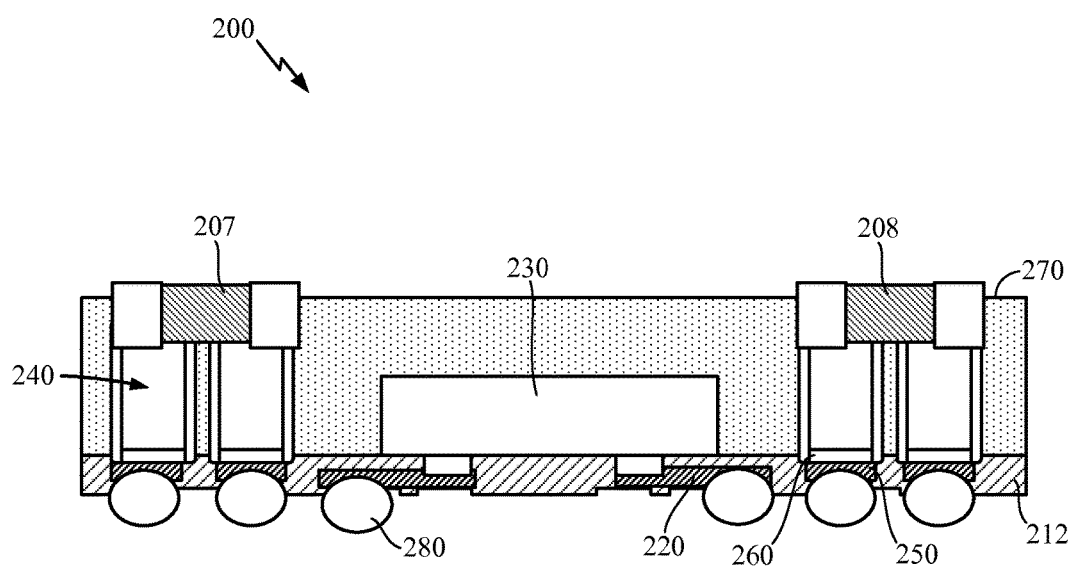

FIG. 2C illustrates a semiconductor package interconnect system in accordance with some examples of the disclosure. As shown in FIG. 2A, a semiconductor package 200 may include a dielectric material 212, a redistribution layer 220 (e.g. one or more metal layers) coupled to the dielectric material 212, a die 230 coupled to the redistribution layer 220, a plurality of conductive pillars 240, a first component 207, and a second component 208. The first component 207 and the second component 208 may be a number of different devices, such as surface mounted components (e.g. active, passive and electromechanical components) and may be coupled to one or more of the plurality of conductive pillars 240 for providing a connection between component and the semiconductor package 200. Each of the plurality of conductive pillars 240 (e.g. conductive pillar 100) may have a core 242 (e.g. core 110 of FIG. 1B), a first layer 244 (e.g. first layer 120 of FIG. 1B) surrounding the core 242, and a second layer 246 (e.g. second layer 130 of FIG. 1B) surrounding the first layer 244. In another example, the conductive pillar 240 (e.g. conductive pillar 100) may have a core 242 and a first layer 244. In other words, in the another example, the conductive pillar may omit the second layer 246. The semiconductor package may include a plurality of conductive pads 250 coupled to redistribution layer 220 between the plurality of conductive pillars 240 and the redistribution layer 220, a plurality of solder joints 260 on the plurality of conductive pads 250 between the plurality of conductive pads 250 and the plurality of conductive pillars 240, and a mold 270 encapsulating the plurality of conductive pillars 240 and the die 230.

Figure 3A:
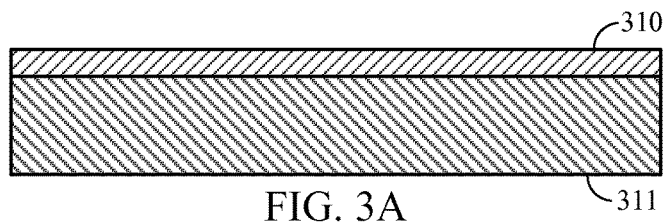
FIGS. 3A-E illustrate a partial process flow for forming a semiconductor package with molding applied after placement of a plurality of conductive pillars in accordance with some examples of the disclosure.
Figure 3B:
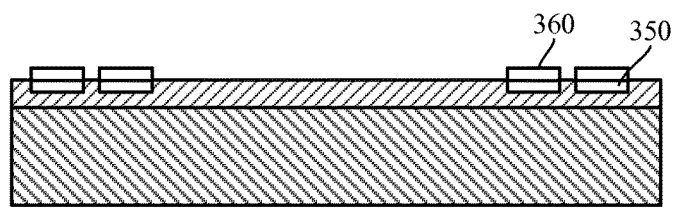
Figure 3C:
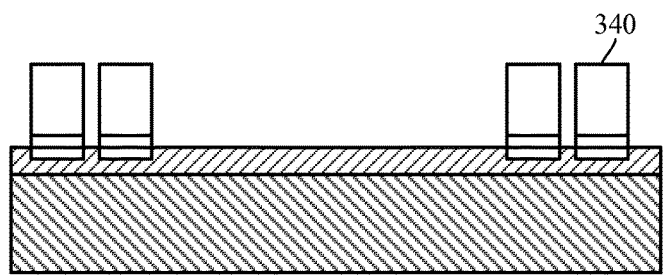
Figure 3D:
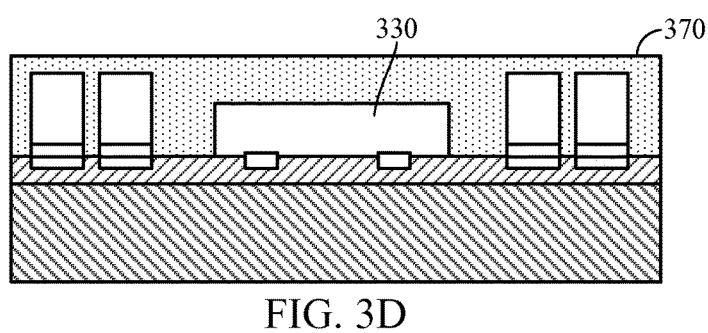
Figure 3E:
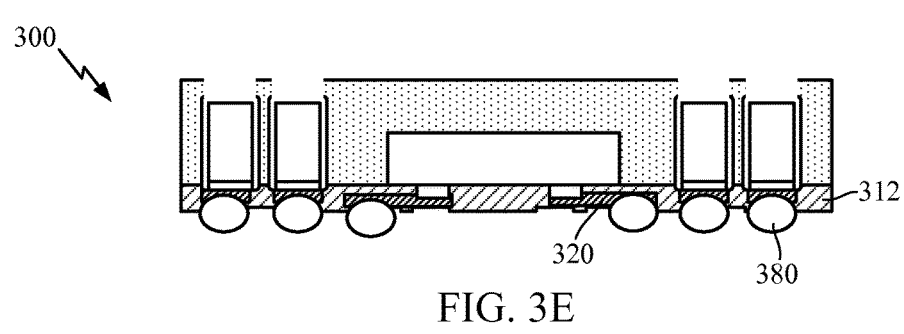

FIGS. 3A-E illustrate a partial process flow for forming a semiconductor package 300 (not shown in Figure) with molding applied after placement of a plurality of conductive pillars in accordance with some examples of the disclosure. As shown in FIG. 3A, the partial process begins with applying an adhesive material (e.g. adhesive tape) 310 to a carrier 311. In FIG. 3B, the process continues with the formation of a plurality of conductive pads 350 on the adhesive material 310 and the formation of a plurality of solder joints 360 on the plurality of conductive pads 350. Next in FIG. 3C, a plurality of conductive pillars 340 (e.g. conductive pillar 100) are aligned with the plurality of conductive pads 350 using a stencil and placed on the plurality of solder joints 360. This is then followed by a solder reflow process that couples the plurality of conductive pads 350 to the plurality of conductive pillars 340 (see for example, FIGS. 1C and D). Next in FIG. 3D, a die 330 is attached to the adhesive material 310 and a molding compound 370 is applied to encapsulate the die 330 and the plurality of conductive pillars 340 followed by the removal of the carrier 311 and adhesive 310. In FIG. 3E, the partial process concludes with the formation of a dielectric layer 312 and a redistribution layer 320 that is coupled to the plurality of conductive pads 350 and the die 330 and the formation of a plurality of solder balls 380 that are also coupled to the redistribution layer 320 for external connections. This is followed by the removal of a portion of the molding compound 370 to expose the plurality of conductive pillars 340.

Figure 4A:
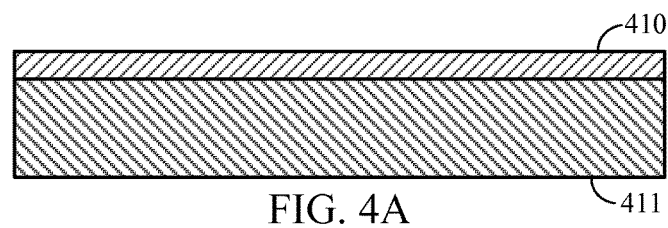
FIGS. 4A-E illustrate a partial process flow for forming a semiconductor package with molding applied before placement of a plurality of conductive pillars in accordance with some examples of the disclosure.
Figure 4B:
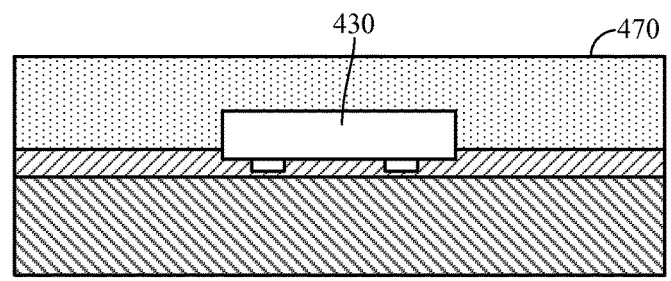
Figure 4C:
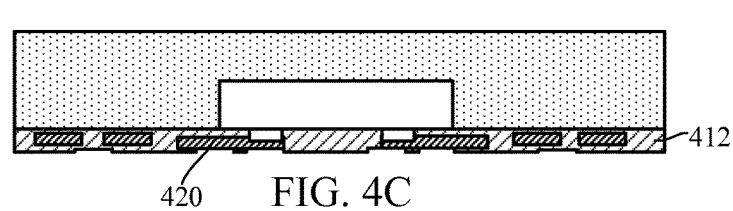
Figure 4D:
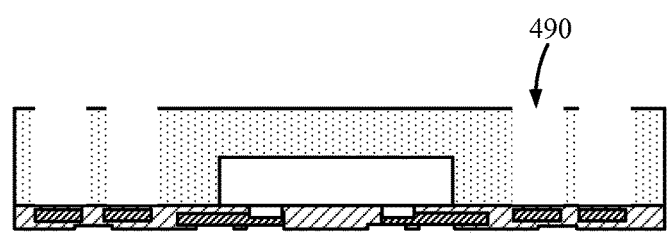
Figure 4E:
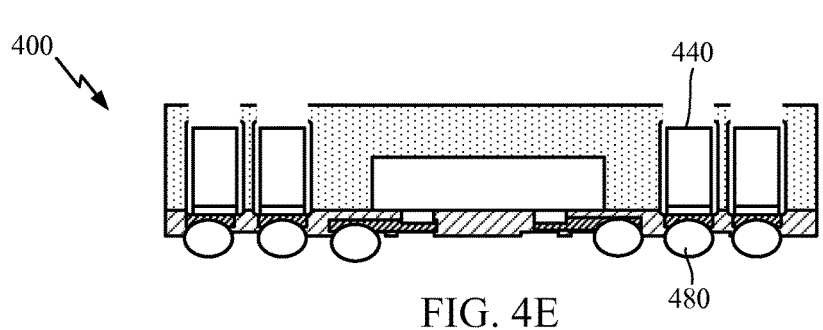

FIGS. 4A-E illustrate a partial process flow for forming a semiconductor package 400 with molding applied before placement of a plurality of conductive pillars in accordance with some examples of the disclosure. As shown in FIG. 4A, the partial process begins with applying an adhesive material (e.g. adhesive tape) 410 to a carrier 411. In FIG. 4B, the process continues with attaching a die 430 to the adhesive material 410 and a molding compound 470 is applied to encapsulate the die 430. Next in FIG. 4C, the partial process continues with the removal of the carrier 411 and adhesive material 410 followed by the formation of a dielectric layer 412 and a redistribution layer 420 that is coupled to the die 430. Next in FIG. 4D, a plurality of holes 490 (e.g. through mold holes) are formed in the molding compound 470 such that a portion of the redistribution layer 420 is exposed. The plurality of holes may be formed by a number of different technologies, such as laser ablation, mechanical drilling or chemical etching. In FIG. 4E, the partial process concludes when a plurality of conductive pillars 440 (e.g. conductive pillar 100) are aligned with the plurality of holes 490 using a stencil and placed in the plurality of holes 490. Next, a solder reflow process is applied that couples the plurality of conductive pillars 440 to the redistribution layer 420 (e.g. see the solder reflow of the conductive pillars shown in FIGS. 1C and D). This may be followed by the formation of a plurality of solder balls 480 that are also coupled to the redistribution layer 420 for external connections.

Figure 5A:
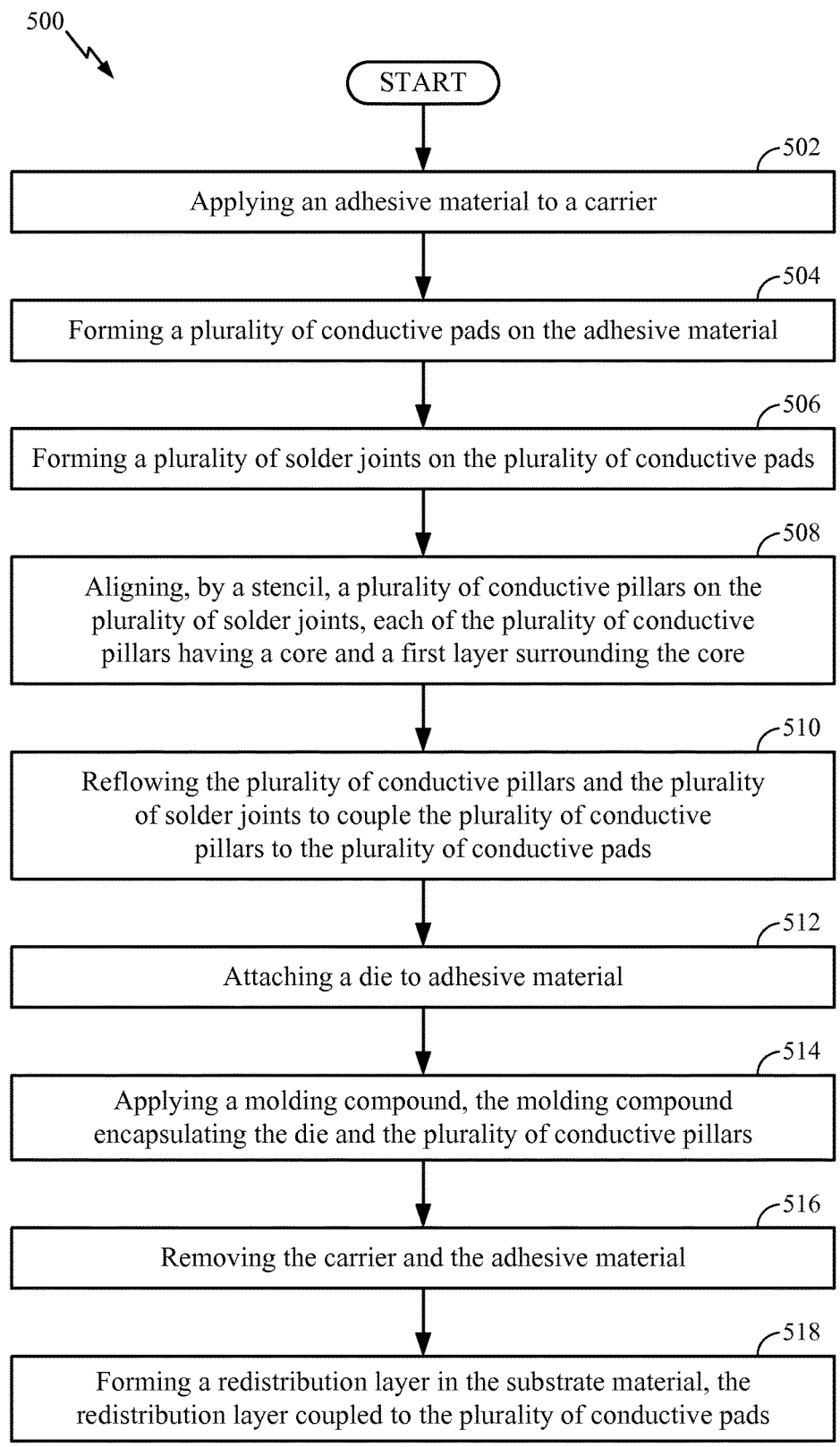
FIG. 5A illustrates a method for forming a semiconductor package with molding applied after placement of a plurality of conductive pillars in accordance with some examples of the disclosure.

FIG. 5A illustrates a method 500 for forming a semiconductor package with molding applied after placement of a plurality of conductive pillars in accordance with some examples of the disclosure. The method 500 starts at block 502 by applying an adhesive material (e.g. adhesive material 310 or 410) to a carrier (e.g. such as carrier 311 or 411). Block 504 includes forming a plurality of conductive pads (such as the plurality of conductive pads 350) on the adhesive material. Block 506 includes forming a plurality of solder joints (such as the plurality of solder joints 360) on the plurality of conductive pads. Block 508 includes aligning, by a stencil, a plurality of conductive pillars on the plurality of solder joints. Each of the plurality of conductive pillars having a core and a first layer surrounding the core. Alternatively the plurality of conductive pillars (e.g. conductive pillars 100, 340 or 440) may have a core (e.g. core 110) and a first layer (e.g. first layer 120) and a second layer (e.g. second layer 130) surrounding the core. Block 510 includes reflowing the plurality of conductive pillars and the plurality of solder joints to couple the plurality of conductive pillars to the plurality of conductive pads. Block 512 includes attaching a die (e.g. die 230, 330, or 430) to adhesive material. Then, block 514 includes applying a molding compound (e.g. molding compound 270, 370, or 470), the molding compound encapsulating the die and the plurality of conductive pillars. Block 516, the carrier and adhesive are removed. The method 500 concludes at block 518, which includes forming a dielectric layer (e.g. dielectric layer 212, 312, or 412) and a redistribution layer (e.g. redistribution layer 220, 320, or 420), the redistribution layer coupled to the plurality of conductive pads.

Figure 5B:
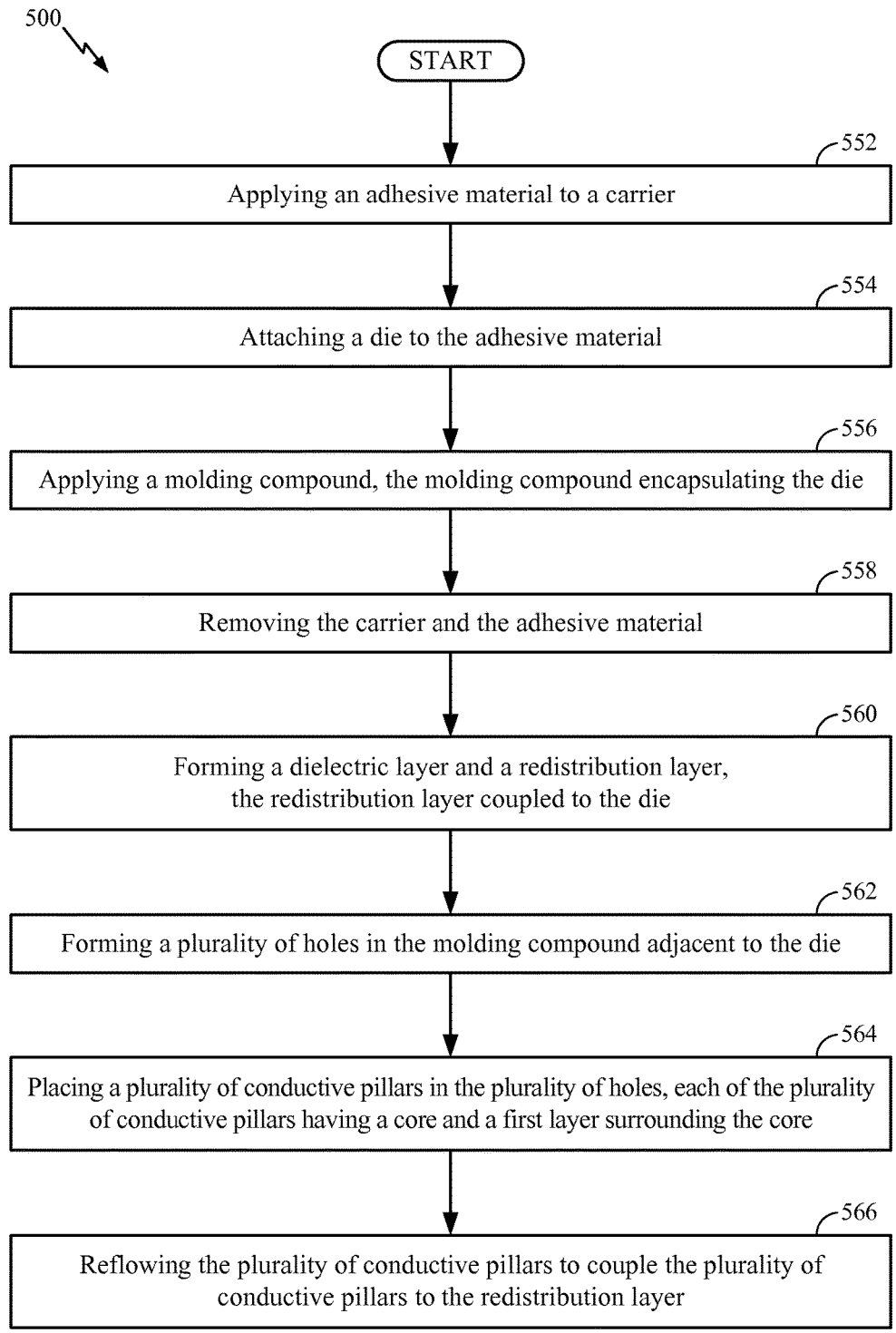
FIG. 5B illustrates a method for forming a semiconductor package with molding applied before placement of a plurality of conductive pillars in accordance with some examples of the disclosure.

FIG. 5B illustrates a method 550 for forming a semiconductor package with molding applied before placement of a plurality of conductive pillars in accordance with some examples of the disclosure. The method 550 begins at block 552, which includes applying an adhesive material (e.g. adhesive material 310 or 410) to a carrier (e.g. such as carrier 311 or 411). The method 550 continues at block 554, which includes attaching a die (e.g. die 230, 330, or 430) to the adhesive material. Block 556 includes applying a molding compound (e.g. molding compound 270, 370, or 470), the molding compound encapsulating the die. Block 558 includes removing the carrier and the adhesive material. Block 560 includes forming a dielectric layer (e.g. dielectric layer 212, 312, or 412) and a redistribution layer (e.g. redistribution layer 220, 320, or 420), the redistribution layer coupled to the die. Block 562 includes forming a plurality of holes (e.g. holes 490) in the molding compound proximate to the die. Block 564 includes placing a plurality of conductive pillars (e.g. conductive pillars 100, 340 or 440) in the plurality of holes. Each of the plurality of conductive pillars having a core (e.g. core 110) and a first layer (e.g. first layer 120) surrounding the core. The method 550 concludes at block 566, which includes reflowing the plurality of conductive pillars to couple the plurality of conductive pillars to the redistribution layer (see FIGS. 1C and D).

In this description, certain terminology is used to describe certain features. The term "mobile device" can describe, and is not limited to, a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). Further, the terms "user equipment" (UE), "mobile terminal," "mobile device," and "wireless device," can be interchangeable.

Figure 6:
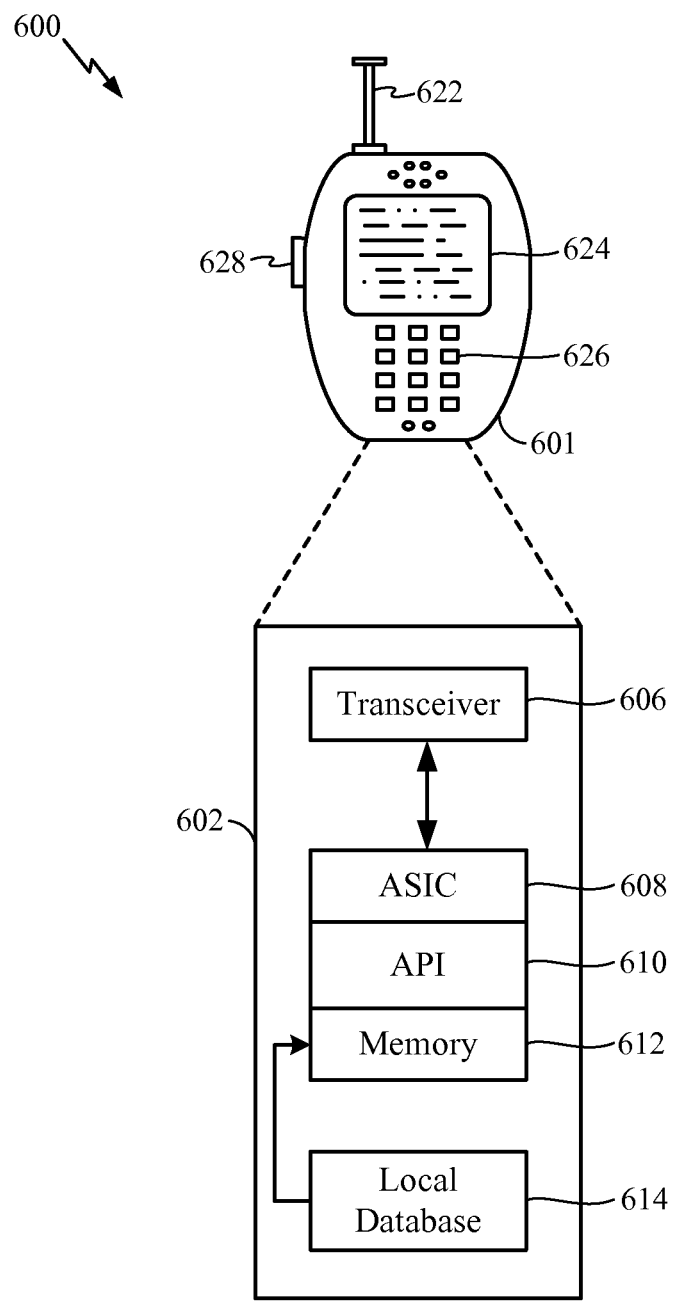
FIG. 6 illustrates exemplary user equipment (UE) in accordance with some examples of the disclosure.

Semiconductor packages in accordance with some examples above (e.g. the semiconductor package 200, the semiconductor package 300, and the semiconductor package 400) can be used for a number of different applications, such as in the circuit components of a mobile device. Referring to FIG. 6 as an example, a system 600 may include an UE 601, (here a wireless device), which has a platform 602 that can receive and execute software applications, data and/or commands transmitted from a radio access network (RAN) that may ultimately come from a core network, the Internet and/or other remote servers and networks. Platform 602 can include transceiver 606 operably coupled to an application specific integrated circuit ("ASIC" 608), or other processor, microprocessor, logic circuit, or other data processing device. ASIC 608 or other processor executes the application programming interface ("API") 610 layer that interfaces with any resident programs in memory 612 of the wireless device. Memory 612 can be comprised of read-only or random-access memory (RAM and ROM), EEPROM, flash cards, or any memory common to computer platforms. Platform 602 also can include local database 614 that can hold applications not actively used in memory 612. Local database 614 is typically a flash memory cell, but can be any secondary storage device as known in the art, such as magnetic media, EEPROM, optical media, tape, soft or hard disk, or the like. Internal platform 602 components can also be operably coupled to external devices such as antenna 622, display 624, push-to-talk button 628 and keypad 626 among other components, as is known in the art.

The wireless communication between UE 601 and the RAN can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE) or other protocols that may be used in a wireless communications network or a data communications network.

The word "exemplary" is used herein to mean "serving as an example, instance, or illustration." Any details described herein as "exemplary" is not necessarily to be construed as preferred or advantageous over other examples. Likewise, the term "examples" does not require that all examples include the discussed feature, advantage or mode of operation. Use of the terms "in one example," "an example," "in one feature," and/or "a feature" in this specification does not necessarily refer to the same feature and/or example. Furthermore, a particular feature and/or structure can be combined with one or more other features and/or structures. Moreover, at least a portion of the apparatus described hereby can be configured to perform at least a portion of a method described hereby.

The terminology used herein is for the purpose of describing particular examples only and is not intended to be limiting of examples of the disclosure. As used herein, the singular forms "a," "an," and "the" are intended to include the plural forms as well, unless the context clearly indicates otherwise. It will be further understood that the terms "comprises", "comprising," "includes," and/or "including," when used herein, specify the presence of stated features, integers, operations, elements, and/or components, but do not preclude the presence or addition of one or more other features, integers, operations, elements, components, and/or groups thereof.

It should be noted that the terms "connected," "coupled," or any variant thereof, mean any connection or coupling, either direct or indirect, between elements, and can encompass a presence of an intermediate element between two elements that are "connected" or "coupled" together via the intermediate element. Coupling and/or connection between the elements can be physical, logical, or a combination thereof. As employed herein, elements can be "connected" or "coupled" together, for example, by using one or more wires, cables, and/or printed electrical connections, as well as by using electromagnetic energy. The electromagnetic energy can have wavelengths in the radio frequency region, the microwave region and/or the optical (both visible and invisible) region. These are several non-limiting and non-exhaustive examples.

Any reference herein to an element using a designation such as "first," "second," and so forth does not limit the quantity and/or order of those elements. Rather, these designations are used as a convenient method of distinguishing between two or more elements and/or instances of an element. Thus, a reference to first and second elements does not mean that only two elements can be employed, or that the first element must necessarily precede the second element. Also, unless stated otherwise, a set of elements can comprise one or more elements. In addition, terminology of the form "at least one of: A, B, or C" used in the description or the claims can be interpreted as "A or B or C or any combination of these elements."

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. A package interconnect apparatus, comprising:
   a conductive pillar with a core and a first layer that at least partially surrounds the core, wherein the core is composed of a drawn copper wire, and the first layer is composed of a solder material and has a reflowed first end wider than a second end opposite the first end;
   a redistribution layer coupled to the conductive pillar; and
   a die coupled to the redistribution layer proximate to the conductive pillar.

2. The package interconnect apparatus of claim 1, wherein the conductive pillar has a second layer between the first layer and the core, the second layer is composed of a conductive interface material.

3. The package interconnect apparatus of claim 1, further comprising:
   a conductive pad coupled to the redistribution layer; and
   a solder joint on the conductive pad between the conductive pad and the conductive pillar.

4. The package interconnect apparatus of claim 1, wherein the conductive pillar has a aspect ratio of a height to a width greater than 2 to 1.

5. The package interconnect apparatus of claim 1, further comprising:
   a plurality of additional conductive pillars, each of the plurality of additional conductive pillars having a core, a first layer surrounding the core, and a second layer between the first layer and the core;
   a plurality of conductive pads coupled to the redistribution layer;
   a plurality of solder joints coupled between the plurality of conductive pads and the plurality of conductive pillars; and
   a mold encapsulating the plurality of conductive pillars and the die.

6. The package interconnect apparatus of claim 1, wherein the conductive pillar comprises a substantially cylindrical shape or a substantially rectangular shape.

7. The package interconnect apparatus of claim 1, wherein the package interconnect system is incorporated into a package on package configuration with the die as part of a bottom package of the package on package configuration or a standalone package that includes a surface mounted device coupled to the conductive pillar.

8. The package interconnect apparatus of claim 1, wherein the semiconductor package interconnect apparatus is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and an automotive device in an automotive vehicle, and further includes the device.

9. A package, comprising:
   a dielectric material;
   a redistribution layer coupled to the dielectric material;
   a die coupled to the redistribution layer;
   a plurality of conductive pillars coupled to the redistribution layer proximate to the die; and
   each of the plurality of conductive pillars comprises a core and a first layer that at least partially surrounds the core, wherein the core is composed of a drawn copper wire and the first layer is composed of a solder material and has a reflowed first end wider than a second end opposite the first end.

10. The package of claim 9, wherein each of the plurality of conductive pillars has a second layer between the first layer and the core, the second layer is composed of a conductive interface material.

11. The package of claim 9, further comprising:
    a plurality of conductive pads coupled to redistribution layer between the plurality of conductive pillars and the redistribution layer; and
    a plurality of solder joints on the plurality of conductive pads between the plurality of conductive pads and the plurality of conductive pillars.

12. The package of claim 9, wherein each of the plurality of conductive pillars has an aspect ratio of a height to a width greater than 2 to 1.

13. The package of claim 9, further comprising a mold encapsulating the plurality of conductive pillars and the die.

14. The package of claim 9, wherein each of the plurality of conductive pillars comprises a substantially cylindrical shape or a substantially rectangular shape.

15. The package of claim 9, wherein the package is incorporated into a package on package configuration with the package as a bottom package of the package on package configuration or a standalone package that includes a surface mounted device coupled to the plurality of conductive pillars.

16. The package of claim 9, wherein the package is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and an automotive device in an automotive vehicle, and further includes the device.

17. A method for forming a package, the method comprising:
    applying an adhesive material to a carrier;
    forming a plurality of conductive pads on the adhesive material;
    forming a plurality of solder joints on the plurality of conductive pads;
    forming a plurality of conductive pillars, each of the plurality of conductive pillars comprises a core of a drawn copper wire and a first layer of solder material that at least partially surrounds the core;
    aligning, by a stencil, a plurality of conductive pillars on the plurality of solder joints;
    reflowing the plurality of conductive pillars and the plurality of solder joints to couple the plurality of conductive pillars to the plurality of conductive pads and wherein the reflowing forms a reflowed first end on each of the plurality of conductive pillars wider than a second end opposite the first end;
    attaching a die to the adhesive material;
    applying a molding compound, the molding compound encapsulating the die;
    removing the carrier and the adhesive material; and forming a dielectric layer and a redistribution layer, the redistribution layer coupled to the plurality of conductive pads.

18. The method of claim 17, wherein the forming the plurality of conductive pillars further comprises forming the plurality of conductive pillars with a second layer between the first layer and the core, forming the second layer from a conductive interface material.

19. The method of claim 17, wherein the forming the plurality of conductive pillars further comprises forming the plurality of conductive pillars with an aspect ratio of a height to a width greater than 2 to 1.

20. The method of claim 17, wherein the forming the plurality of conductive pillars further comprises forming the plurality of conductive pillars with each of the plurality of conductive pillars is a substantially cylindrical shape or a substantially rectangular shape.

21. The method of claim 17, wherein the package is incorporated into a package on package configuration with the package as a bottom package of the package on package configuration or a standalone package that includes a surface mounted device coupled to the plurality of conductive pillars.

22. The method of claim 17, wherein the applying the molding compound further comprises encapsulating the plurality of conductive pillars.

23. The method of claim 17, further comprising forming a plurality of holes in the molding compound proximate to the die; and placing the plurality of conductive pillars in the plurality of holes.

24. The method of claim 17, wherein the package is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and an automotive device in an automotive vehicle, and further includes the device.

* * * * *